(12) United States Patent
Koppal

(10) Patent No.: US 9,965,000 B2
(45) Date of Patent: May 8, 2018

(54) INTEGRATED PROTECTIVE MESH

(71) Applicant: Microsoft Technology Licensing, LLC, Redmond, WA (US)

(72) Inventor: Rohit Krishna Koppal, Redmond, WA (US)

(73) Assignee: MICROSOFT TECHNOLOGY LICENSING, LLC., Redmond, WA (US)

( * ) Notice: Subject to any disclaimer, the term of this patent is extended or adjusted under 35 U.S.C. 154(b) by 28 days.

(21) Appl. No.: 14/691,237

(22) Filed: Apr. 20, 2015

(65) Prior Publication Data

US 2016/0306399 A1    Oct. 20, 2016

(51) Int. Cl.
*H05K 1/00*   (2006.01)
*G06F 1/18*   (2006.01)
(Continued)

(52) U.S. Cl.
CPC .............. *G06F 1/182* (2013.01); *G06F 1/163* (2013.01); *G06F 1/1656* (2013.01); *H04M 1/18* (2013.01);
(Continued)

(58) Field of Classification Search
CPC ........... H04B 2001/3894; H05K 3/361; H05K 1/189; H05K 1/028; H05K 1/181;
(Continued)

(56) References Cited

U.S. PATENT DOCUMENTS

| 4,987,592 A | 1/1991 | Flagg |
| 7,581,296 B2 | 9/2009 | Yetter et al. |

(Continued)

FOREIGN PATENT DOCUMENTS

| KR | 20040085569 | 10/2004 |
| KR | 20120122081 | 11/2012 |
| WO | WO-2007123293 | 11/2007 |

OTHER PUBLICATIONS

"3SM101EHT01B MEMS Microphone", Available at: <http://www.3system.com.tw/upload/product/9dc54430368dd475195f3c944f420f84.doc>, Jan. 30, 2015, 13 pages.

(Continued)

*Primary Examiner* — Robert J Hoffberg
*Assistant Examiner* — Hung Dang

(57) ABSTRACT

Integrated protective mesh techniques are described herein. In one or more implementations, a computing device includes electronic components attached to circuitry for the computing device, such as a flexible printed circuit (FPC). The electronic components are sensitive devices such as audio components and other sensors that rely on exposure to environmental inputs for operation and that may be adversely impacted by external contaminants (water, dust, ferritic material, etc.). To provide for proper operation of the electronic components, a housing for the computing device includes a port for the electronic components that extends from outside of the housing to an interior of the housing to create a pathway through the housing. A protective mesh is assembled as an integrated component of the circuitry (e.g., FPC) and configured to align with the port to protect the electronic components from passage of contaminants through the pathway created by the port.

20 Claims, 7 Drawing Sheets

(51) Int. Cl.
*G06F 1/16* (2006.01)
*H05K 1/02* (2006.01)
*H05K 1/18* (2006.01)
*H05K 3/10* (2006.01)
*H05K 3/30* (2006.01)
*H04M 1/18* (2006.01)
*H04R 1/08* (2006.01)

(52) U.S. Cl.
CPC ............ *H04R 1/086* (2013.01); *H05K 1/028* (2013.01); *H05K 1/181* (2013.01); *H05K 3/10* (2013.01); *H05K 3/303* (2013.01); *H04R 2499/11* (2013.01); *H04R 2499/15* (2013.01)

(58) Field of Classification Search
CPC .......... H05K 3/10; H05K 3/303; G06F 1/182; G06F 1/163; G06F 1/1656; H04M 1/18; H04R 1/086; H04R 2499/11
See application file for complete search history.

(56) References Cited

U.S. PATENT DOCUMENTS

| | | | |
|---|---|---|---|
| 8,306,252 B2 | 11/2012 | Dinh et al. | |
| 8,509,459 B1 | 8/2013 | Isvan | |
| 8,724,841 B2 | 5/2014 | Bright et al. | |
| 8,804,363 B2 | 8/2014 | Minoo et al. | |
| 8,804,993 B2 | 8/2014 | Shukla et al. | |
| 2011/0255726 A1* | 10/2011 | Yu | H04R 1/025 381/332 |
| 2012/0314354 A1* | 12/2012 | Rayner | G06F 1/1656 361/679.01 |
| 2013/0148837 A1 | 6/2013 | Lee et al. | |
| 2013/0170109 A1 | 7/2013 | Cohen et al. | |
| 2014/0044297 A1 | 2/2014 | Loeppert et al. | |
| 2014/0198466 A1 | 7/2014 | Sawadski et al. | |
| 2014/0254851 A1 | 9/2014 | Chen | |

OTHER PUBLICATIONS

Weinstein,"Integrated Microphone Array Implementation", Available at: <http://download.microsoft.com/download/a/f/7/af7777e5-7dcd-4800-8a0a-b18336565f5b/integratedmicrophonearrayimplementation_marcieweinstein.doc>, Apr. 6, 2006, 7 pages.

"International Search Report & Written Opinion Issued in PCT Application No. PCT/US2016/025965", dated Jul. 8, 2016, 12 Pages.

"Second Written Opinion", Application No. PCT/US2016/025965, dated Mar. 21, 2017, 7 pages.

"International Preliminary Report on Patentability Issued in PCT Application No. PCT/US2016/025965", dated Jun. 29, 2017, 8 Pages.

* cited by examiner

500 ⟶

502
Assemble a flexible printed circuit (FPC) for inclusion in a computing device, the FPC configured to arrange one or more electronic components for exposure to an exterior of the computing device via a port formed through a housing of the computing device when the FPC is included in the computing device

504
Integrate within the flexible printed circuit (FPC) a protective mesh for the one or more electronic components as part of the assembly, the protective mesh configured to align with the port of the housing when the FPC is included in the computing device to protect the or more electronic components from contaminants from the exterior of the computing device

602
Form a housing for a computing device having a port that extends from an exterior of the housing to an interior of the housing to create a pathway through the housing

604
Fabricate circuitry for the computing device having one or more electronic components and a protective mesh for the one or more electronic components that is integrated with the circuitry

606
Assemble the housing with the circuitry such that the port is aligned with the one or more electronic components arranged in the interior of the housing to at least partially expose the electronic components to the exterior of the housing via the pathway and the protective mesh is aligned with the port to protect the or more electronic components from contaminants

*Fig. 6*

INTEGRATED PROTECTIVE MESH

BACKGROUND

A variety of kinds of computing devices have been developed to provide computing functionality to users in different settings. For example, a user may interact with a mobile phone, tablet computer, wearable device or other computing device to check email, surf the web, compose texts, interact with applications, and so on. Operation of some electronic components included with computing devices may depend upon exposure of the components at least partially to exterior elements via ports (e.g., apertures) formed in housings of the computing devices. For example, audio components such as speakers and microphones may rely upon passage of sound waves through such ports and other types of sensors such as pressure sensors and photosensitive devices may also rely upon exposure to air, light, pressure, and other environmental inputs.

One challenge associated with such components is adequate sealing of the ports to prevent contaminants from reaching and degrading performance of the components. Traditionally, one or more sealing layers, barrier layers and/or cover layers that are separate from the electronic components and circuitry are employed. However, inclusion of these additional layers can increase material cost and add to the overall thickness of the device, which may be undesirable. Further, the use of multiple layers creates additional potential failure points for sealing, which makes control during assembly more difficult and can also adversely impact device performance and/or longevity.

SUMMARY

Integrated protective mesh techniques are described herein. In one or more implementations, a computing device includes one or more electronic components attached to circuitry for the computing device, such as a flexible printed circuit (FPC). The one or more electronic components are sensitive devices such as audio components and other sensors that rely on exposure to environmental inputs for operation and that may be adversely impacted by contaminants (e.g., water, dust, ferritic material, etc.). To provide for proper operation of the electronic components, a housing for the computing device includes a port for the electronic components that extends from outside of the housing to an interior of the housing to create a pathway through the housing. For protection, a protective mesh is assembled as an integrated component of the circuitry (e.g., the FPC) and configured to align with the port to protect the electronic components from passage of contaminants through the pathway created by the port.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

FIG. 5 depicts an example procedure in which a flexible printed circuit (FPC) is assembled with an integrated protective mesh in accordance with one or more implementations.

FIG. 6 depicts an example procedure in which a computing device including an integrated protective mesh to protect electronic components is assembled in accordance with one or more implementations.

DETAILED DESCRIPTION

Overview

Traditional techniques for sealing of audio components (speakers, microphones, audio transducers, headphones, earpiece, etc.) and other sensitive devices in circuitry of a computing device involve using additional sealing layers, barrier layers, and/or cover layers that are separate from the circuitry. Using these additional layers, though, increases material cost, adds to the overall thickness of the device, and creates additional potential points of failure for sealing.

Integrated protective mesh techniques are described herein. In one or more implementations, a computing device includes one or more electronic components attached to circuitry for the computing device, such as a flexible printed circuit (FPC). The one or more electronic components are sensitive devices such as audio components and other sensors that rely on exposure to environmental inputs for operation and that may be adversely impacted by external contaminants (e.g., water, dust, ferritic material). To provide for proper operation of the electronic components, a housing for the computing device includes a port for the electronic components that extends from outside of the housing to an interior of the housing to create a pathway through the housing. A protective mesh is assembled as an integrated component of the circuitry (e.g., the FPC) and configured to align with the port to protect the electronic components from passage of contaminants through the pathway created by the port.

Integrated protective mesh techniques as described in this document enable integrated assemblies that provide efficient and cost effective production of computing devices having various form factors. Because a protective mesh is integrated directly as part of circuitry (e.g., the FPC), the number of layers used to produce a device can be reduced. Consequently, overall thickness of the device and/or FCB assembly can be correspondingly reduced. Moreover, fewer layers are relied upon for sealing of sensitive devices, which simplifies the control process for manufacturing and increase reliability by reducing potential points of sealing failure.

In the discussion that follows, a section titled "Operating Environment" is provided and describes one example environment in which one or more implementations can be employed. Following this, a section titled "Integrated Protective Mesh Details" describes example details and procedures in accordance with one or more implementations. Last, a section titled "Example System" describes example computing systems, components, and devices that can be utilized for one or more implementations of integrated protective meshes.

Operating Environment

Figure 1:
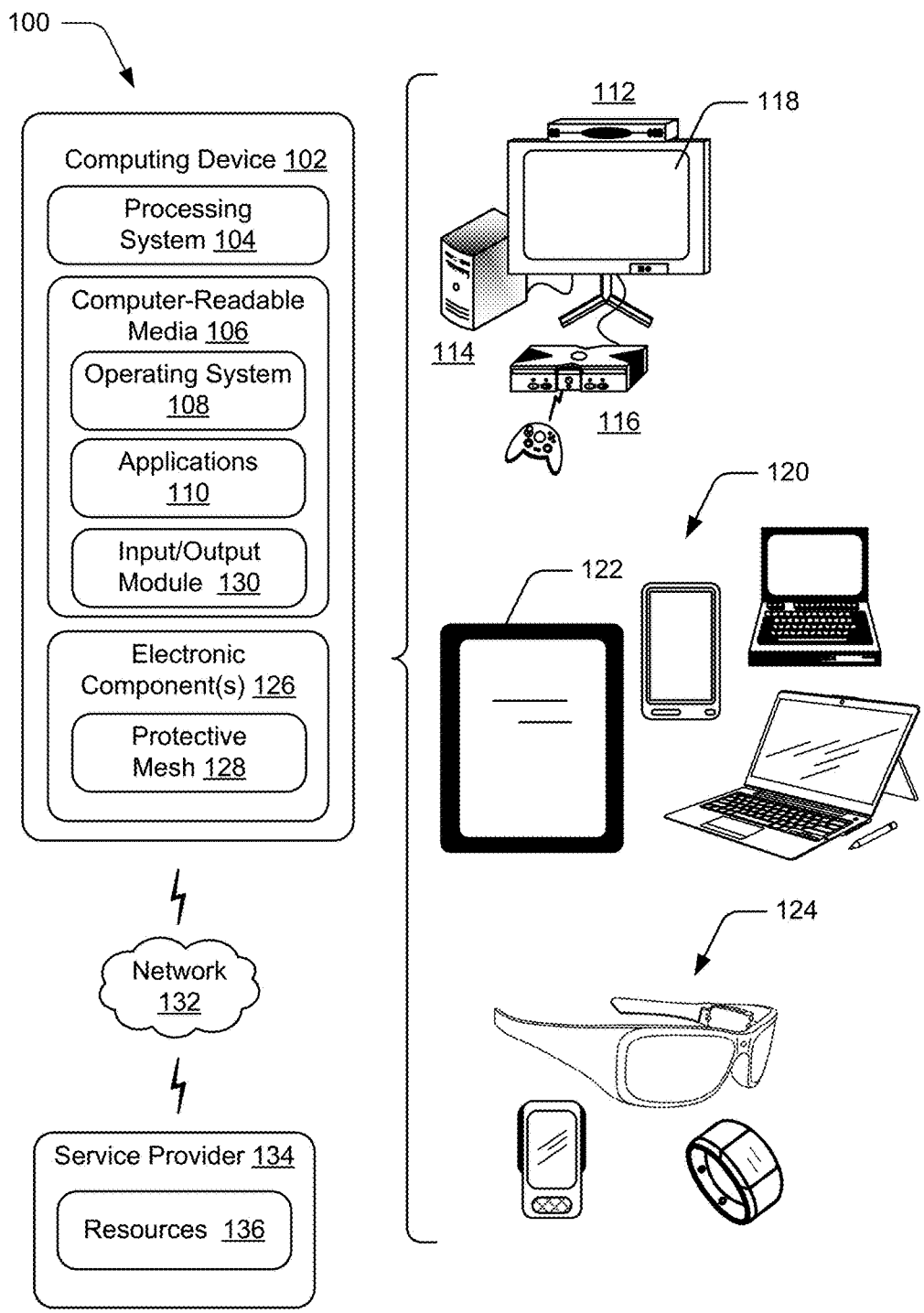
FIG. 1 is an illustration of an example operating environment that is operable to employ the integrated protective mesh techniques described herein in accordance with one or more implementations.

FIG. 1 illustrates an operating environment in accordance with one or more implementations, generally at 100. The environment 100 includes a computing device 102 having a processing system 104 with one or more processors and devices (e.g., CPUs, GPUs, microcontrollers, hardware elements, and fixed logic devices), one or more computer-readable media 106, an operating system 108, and one or more applications 110 that reside on the computer-readable media and which are executable by the processing system. The processing system 104 may retrieve and execute computer-program instructions from applications 110 to provide a wide range of functionality to the computing device 102, including but not limited to gaming, office productivity, email, media management, printing, networking, web-browsing, and so forth. A variety of data and program files related to the applications 110 can also be included, examples of which include games files, office documents, multimedia files, emails, data files, web pages, user profile and/or preference data, and so forth.

The computing device 102 can be embodied as any suitable computing system and/or device such as, by way of example and not limitation, a gaming system, a desktop computer, a portable computer, a tablet or slate computer, a handheld computer such as a personal digital assistant (PDA), a cell phone, a set-top box, a wearable device (e.g., watch, band, glasses, etc.), and the like. For example, as shown in FIG. 1 the computing device 102 can be implemented as a television client device 112, a computer 114, and/or a gaming system 116 that is connected to a display device 118 to display media content. Alternatively, the computing device may be any type of portable computer, mobile phone, or portable device 120 that includes an integrated display 122. A computing device may also be configured as a wearable device 124 that is designed to be worn by, attached to, carried by, or otherwise transported by a user. Examples of wearable devices 124 depicted in FIG. 1 include glasses, a smart band or watch, and a pod device such as clip-on fitness device, media player, or tracker. Other examples of wearable devices 124 include but are not limited to a ring, an article of clothing, a glove, and a bracelet, to name a few examples. Any of the computing devices can be implemented with various components, such as one or more processors and memory devices, as well as with any combination of differing components. One example of a computing system that can represent various systems and/or devices including the computing device 102 is shown and described below in relation to FIG. 7.

The computer-readable media can include, by way of example and not limitation, all forms of volatile and non-volatile memory and/or storage media that are typically associated with a computing device. Such media can include ROM, RAM, flash memory, hard disk, removable media and the like. Computer-readable media can include both "computer-readable storage media" and "communication media," examples of which can be found in the discussion of the example computing system of FIG. 7.

The computing device 102 may include or make use of one or more electronic components 126 as described above and below. As noted, the electronic components 126 are representative of various sensitive devices such as audio components and other sensors that rely upon exposure to environmental inputs/elements for operation and that may be adversely impacted by external contaminants. Examples of audio components include but are not limited to microphones, speakers, audio transducers, headphones, an earpiece, and so forth. Examples of other sensors include but are not limited to pressure sensors, a camera, a barometer, user presence detectors, an altimeter, and photosensitive devices such as light detectors, LED devices, and photodiodes. It is further contemplated that the techniques described herein may be applied in conjunction with other kinds of ports and apertures such as device vents and connector ports.

In order to protect electronic components, a protective mesh 128 as described in greater detail below may be employed to protect the electronic components from contaminants, such as water, dust, ferritic material, and so forth. By way of introduction, the protective mesh 128 is generally assembled as an integrated component of circuitry for a device such as a flexible printed circuit (FPC) for a dedicated audio system, or circuitry for an integrated multiple sensor system of a device. To provide for proper operation of the electronic components, a housing for the computing device includes a port for the electronic components that extends from outside of the housing to an interior of the housing to create a pathway through the housing. Thus, the electronic components can be exposed at least partially to environmental inputs/elements via the pathway formed by a port (or by multiple pathways of multiple such ports). In this context, a protective mesh 128 integrated with circuitry is configured to align with a corresponding port to protect electronic components from passage of contaminants through the pathway created by the port. Details regarding these and other aspects of integrated protective mesh techniques are discussed in relation to the following figures.

The computing device 102 of FIG. 1 is additionally illustrated as including an input/output module 130. The input/output module 130 is representative of functionality relating to processing of inputs and rendering outputs of the computing device 102. A variety of different inputs may be processed by the input/output module 130, such as inputs relating to operation of controls of an input device, keys of a virtual keyboard, identification of gestures through touchscreen functionality, and so forth. Responsive to the inputs, the input/output module 130 causes corresponding operations to be performed. Thus, the input/output module 130 may support a variety of different input techniques by recognizing and leveraging a division between types of inputs including key presses, gestures, control interaction, and so on.

The environment 100 of FIG. 1 further depicts that the computing device 102 may be communicatively coupled via a network 132 to a service provider 134, which enables the computing device 102 to access and interact with various resources 136 made available by the service provider 134. The resources 136 can include any suitable combination of content and/or services typically made available over a network by one or more service providers. For instance, content can include various combinations of text, video, ads, audio, multi-media streams, animations, images, webpages, and the like. Some examples of services include, but are not limited to, an online computing service (e.g., "cloud" computing), an authentication service, web-based applications, a file storage and collaboration service, a search service, messaging services such as email and/or instant messaging, and a social networking service.

Having described an example operating environment, consider now example details and techniques associated with one or more implementations of an integrated protective mesh.

Integrated Protective Mesh Details

Figure 2:
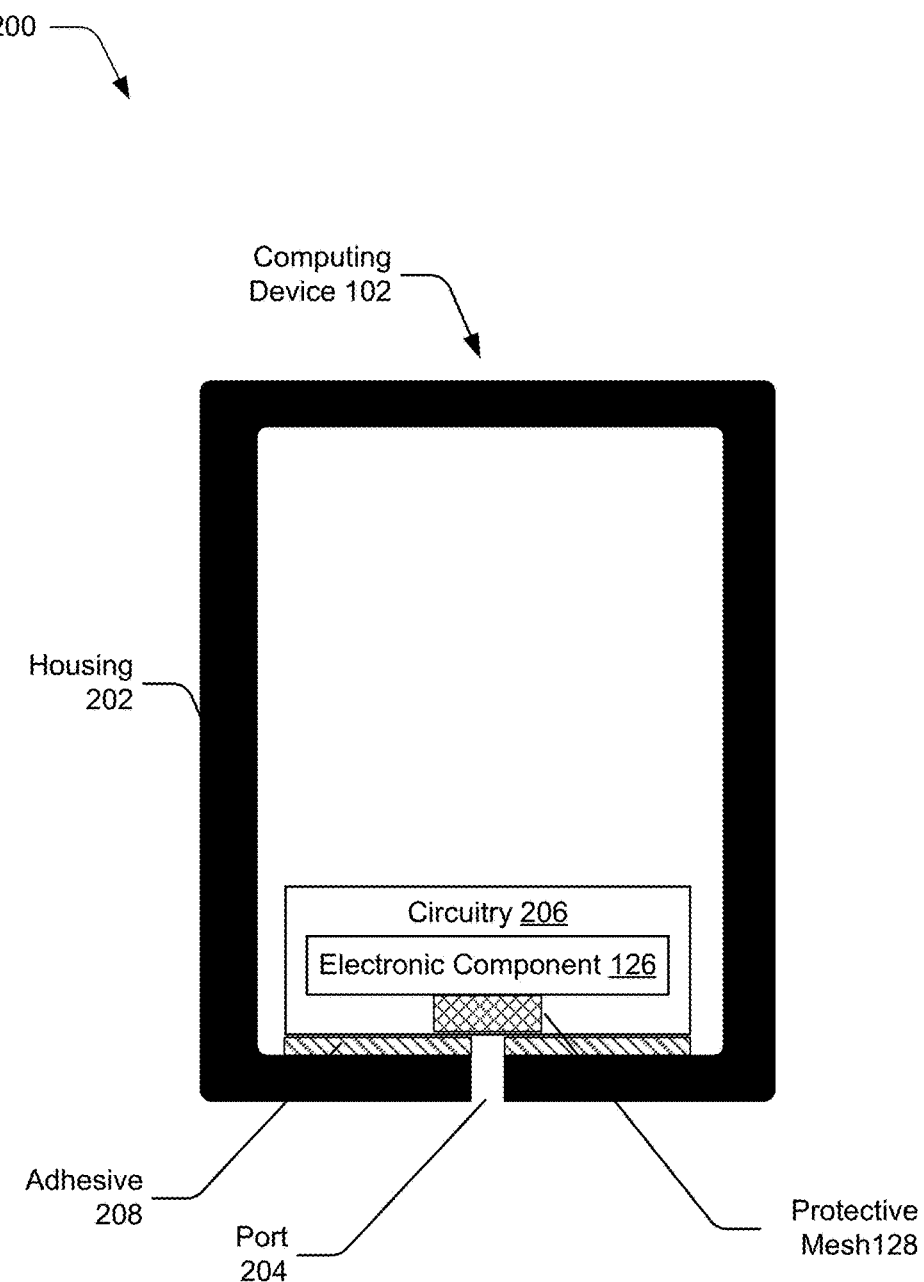
FIG. 2 depicts a representative example of a computing device having integrated protective mesh in accordance with one or more implementations.

FIG. 2 depicts generally at 200 a representative example of a computing device having integrated protective mesh in accordance with one or more implementations. In the illustrated example a computing device 102 in the form of a tablet is depicted as a representative example, however, the techniques and inventive concepts described herein are equally applicable to others kinds of devices including but not limited to mobile devices, laptop devices, wearable devices, set-top boxes, and even desktop computers. The example computing device 102 includes a housing 202 that represents a shell or casing in which various components for the device are contained, secured, and interconnected to form the device and provide corresponding functionality. The housing 202 may be formed from various materials (e.g., metal, plastic, rubber, wood, and combination thereof) and may have different sizes and shapes for different kinds of devices.

In accordance with techniques described herein, the housing 202 is configured to include at least one port 204. The port 204 represents an aperture or tunnel that extends from outside of the housing to an interior of the housing to create a pathway through the housing. The port 204 or multiple ports in the housing can be located to correspond to positions of electronic components that are attached to and/or integrated with circuitry for the computing device that is contained in the housing 202.

For example, FIG. 2 depicts an example electronic component 126 that is included as part of example circuitry 206. The circuitry 206 includes a protective mesh 128 that is configured as an integrated component of the circuitry 206. In other words, the protective mesh 128 is internal to the circuitry 206 and/or assembled as part of the circuitry 206 rather than being formed as a separate layer that is applied or attached externally with respect to the circuitry 206. As depicted in FIG. 2, the port 204 is aligned with the electronic component 126 such that the pathway formed by the port exposes the electronic component 126 to the exterior of the housing. Additionally, the protective mesh 128 is aligned with the port 204 to protect the electronic components from passage of contaminants through the pathway created by the port 204.

The circuitry 206 represents any suitable circuit board or circuit device that can be used to implement electronic components 126 as discussed herein. In one or more implementations, the circuitry 206 is configured as a flexible printed circuit board (FCB) that is formed as a stack of layers. The FCB may be assembled by laminating the layers together using adhesive. In this example, the protective mesh 128 can be integrated as a layer within the stack of layers for the FCB. Circuitry 206 may also represent other kinds of circuits and printed circuit boards (PCBs) that can be formed using various manufacturing and assembly techniques and in a multitude of different arrangements. In any case, the protective mesh 128 is formed and/or assembled as an integrated component of the circuitry 206. Since, the protective mesh 128 is already included within the circuitry 206, a single layer of adhesive 208 is sufficient to secure the circuitry including the mesh and attached electronic components to the housing 202 as represented in FIG. 2.

The protective mesh 128 can be configured in various ways to seal the pathway and/or act as a barrier to prevent contaminants from reaching and degrading or damaging the electronic components. For example, the mesh can be constructed as metal, fabric, or plastic meshes (or combinations thereof) that are designed to filter out at least some type of containments. For audio components, the protective mesh 128 may be selected as an acoustic mesh or membrane that enables conveyance of air (e.g., sound waves) through the protective mesh while still acting as a barrier for dust and ferritic material. In addition or alternatively, the mesh can be configured as a membrane that seals the port 204 to provide water-resistance. For example, the mesh can be configured as a hydrophobic membrane, one example of which is a polytetrafluoroethylene (e.g., Teflon®) membrane. In one or more implementations, the protective mesh 128 has a thickness equal to or less than about 0.01 millimeters.

Electronic components 126 can be attached to the FCB or other circuitry 206 in various ways. In one approach, the electronic components 126 are surface mounted to the FCB using surface mount technology (SMT) to solder, weld, fuse, adhere or otherwise attach the components to the surface of the FCB. As noted, the techniques for integrating a protective mesh within circuitry 206 enable a reduction in the overall thickness of the assembly. In comparison to techniques in which a mesh is added as an external layer (e.g., separate from the circuitry or FCB assembly) a reduction of about 0.5 millimeters or greater can be achieved. This equates to a reduction in the thickness of an assembly including the electronic components and the flexible printed circuit (FPC) with the protective mesh from a range of about 1.8 to 2.00 millimeters down to a range of about 1.3 to 1.5 millimeters. More generally, the resulting thickness may be equal to or less than about 1.5 millimeters. Additionally, a reduction in the amount of adhesive necessary to secure and seal the port can also be achieved since the mesh is internal to the circuit and there is just a single application of adhesive to control in the assembly process. The adhesive reduction equates to reducing a footprint of the adhesive (e.g., the sealing surface) from a diameter of about 5 to 6 millimeters down to a diameter of about 2.8 to 3.0 millimeters.

Figure 3:
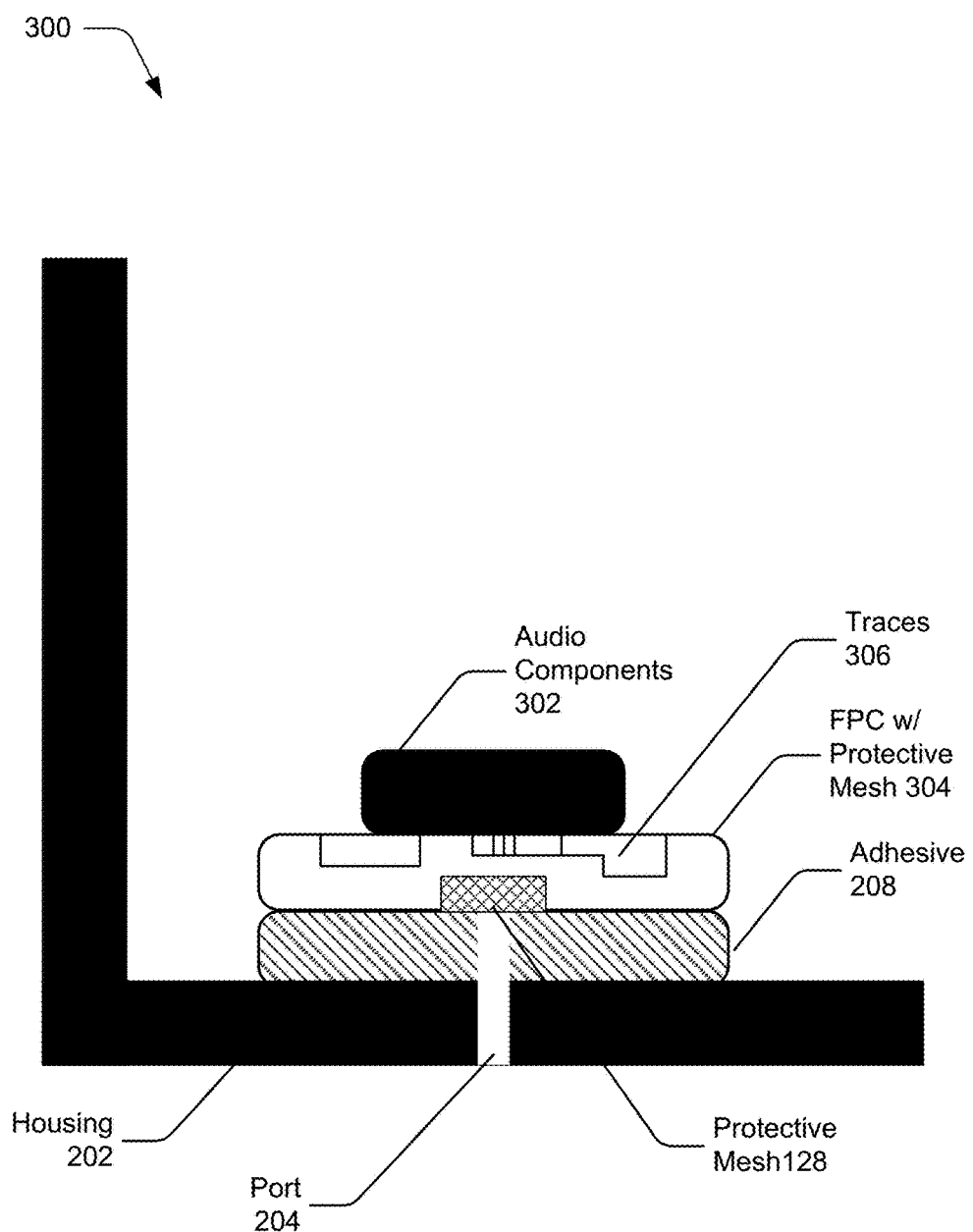
FIG. 3 depicts a cross section of a portion of a computing device showing an example stack of layers including a flexible printed circuit (FPC) with an integrated protective mesh in accordance with one or more implementations.

To further illustrate, FIG. 3 depicts generally at 300 a cross section of a portion of a computing device showing an example stack of layers including a flexible printed circuit (FPC) in accordance with one or more implementations. In particular, FIG. 3 depicts an example implementation in which electronic components in the form of one or more audio components 302 are attached to circuitry in the form of a flexible printed circuit (FPC) 304 having an integrated protective mesh 128. Although audio components 302 are depicted, various other arrangements involving different kinds of components and/or combinations of different kinds of components are also contemplated.

In the represented example, an assembly of the FPC 304 including the protective mesh 128 and the audio components 302 is adhered to a housing 202 of a computing device 102 via adhesive 208 in a single layer that is external to the FPC 304. The housing 202 includes a port 204 as described previously that partially exposes the audio components 302 to environmental inputs/elements on the exterior of the housing 202. As noted previously, the port 204 is aligned with the protective mesh 128 and the audio components to provide a pathway between the components and an exterior of the housing 202 while at the same time protecting the components from contaminants. In an implementation, a central axis of the protective mesh 128 is substantially aligned with a central axis of the port 204 and/or a central axis of at least one electronic component 126.

As further represented in FIG. 3, the FPC 304 includes the protective mesh 128 as one of a plurality of layers and may also include one or more layers having traces 306. The traces 306 represent conductive pathways that provide electrical interconnection between components that are adhered to or otherwise connected to the FPC 304. For example, the traces 306 may be configured at routing paths included within a conductive layer of the FPC, such as a copper or gold layer in which various interconnection circuitry is formed on top of a base layer substrate.

Figure 4:
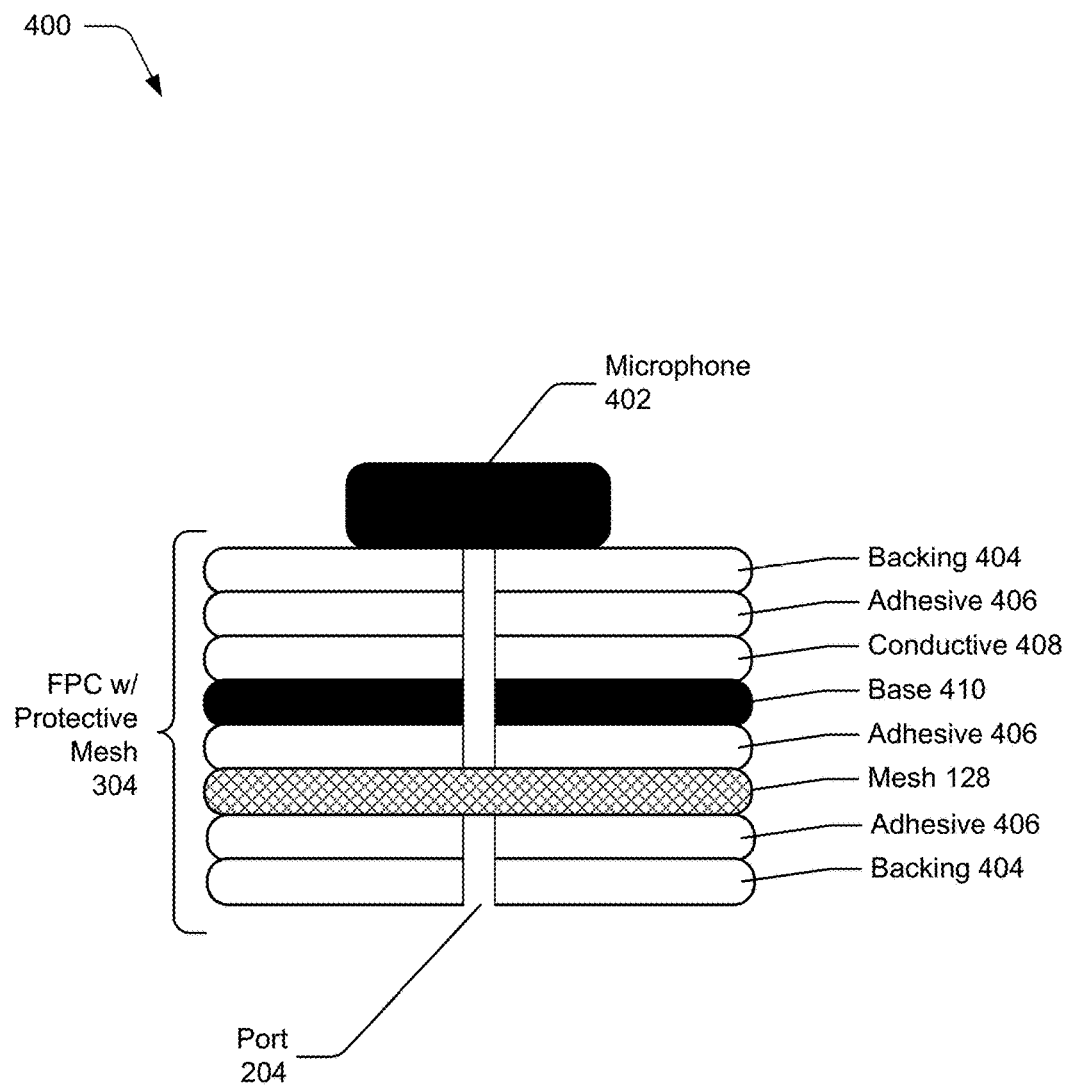
FIG. 4 depicts a cross section view of a representative flexible printed circuit (FPC) layer of FIG. 3 showing details of the stack of layers in accordance with one or more implementations.

FIG. 4 depicts generally at 400 a cross section view of a representative flexible printed circuit (FPC) layer of FIG. 3 showing details of the stack of layers in accordance with one or more implementations. In this example, an electronic component in the form of a microphone 402 is depicted by way of example and not limitation. Naturally, various other kinds of electronic components 126 as described above and below are also contemplated. In this example, however, the microphone 402 is depicted as being surface mounted to an FPC that comprises a plurality of layers in a stack. Generally, the layers of material for the FPC are laminated together using suitable adhesive between layers, such as various pressure sensitive adhesives (PSA).

The port 204 is formed through the layers of the FPC 304. In one approach, individual layers are die cut, drilled, stamped, punched, molded and/or otherwise configured to include apertures or holes that when joined together in a stack of layers form the port 204 and corresponding pathways. The protective mesh is implemented in a layer that extends across the apertures or holes of the other layers to provide protection for the microphone and/or other components in the manner described herein.

A variety of different configurations of layers for an FPC 304 are contemplated. By way of example and not limitation, the representative stack of layers for the FPC includes backing layers 404 or cover layers on either side of the stack. Naturally, the ordering of the layers as well as the number and types of different layers can be varied in dependence upon the particular device and/or usage scenario. The backing layers 404 are designed as outer layers that contain the inner layers and provide a degree of stability to the stack. Various adhesive layers 406 are interspersed between the other layers to join the layers one to another and thereby create a laminated stack having a plurality of layers. A conductive layer 408 is depicted as being adjoined to a base layer 410 such as a poly imide base or other suitable substrate. The base layer 410 acts as a supporting layer of non-conductive material upon which conductive materials (e.g., traces 306) are disposed to form the interconnections and routings for the circuitry. The conductive layer 408 may comprise traces 306 of various suitable conductive materials such as copper, gold, platinum, and other conductors without limitation.

In the illustrated example, a protective mesh 128 is depicted as an integrated layer of the FPC 304 that is disposed between the base layer 410 and the backing layer 404 on the portion of the stack that is opposite of the microphone 402 (e.g., the electronic component). As illustrated, the protective mesh 128 extends across the opening of the port 204 to seal the opening and thereby protect the microphone and/or any other electronic components within the interior of the housing.

FIG. 5 depicts an example procedure 500 in which a flexible printed circuit (FPC) is assembled with an integrated protective mesh in accordance with one or more implementations. The procedures herein are represented as a set of blocks that specify operations performed by one or more entities and are not necessarily limited to the orders shown for performing the operations by the respective blocks. In general, functionality, features, and concepts described in relation to the examples above and below may be employed in the context of the example procedures described in this section. Further, functionality, features, and concepts described in relation to different figures and examples in this document may be interchanged among one another and are not limited to implementation in the context of a particular figure or procedure. Moreover, blocks associated with different representative procedures and corresponding figures herein may be applied together and/or combined in different ways. Thus, individual functionality, features, and concepts described in relation to different example environments, devices, components, and procedures herein may be used in any suitable combinations and are not limited to the particular combinations represented by the enumerated examples in this description.

A flexible printed circuit (FPC) for inclusion in a computing device is assembled, the FPC configured to arrange one or more electronic components for exposure to an exterior of the computing device via a port formed through a housing of the computing device when the FPC is included in the computing device (block 502). For example, circuitry 206 in the form of an FPC 304 may be assembled as previously discussed. The FPC 304 may be formed as a plurality of layers of different materials. Various electronic components 126 may be adjoined to the FPC such as by surface mounting, fabrication along with the FPC, adhesive joints, or other suitable securing mechanisms.

A protective mesh for the one or more electronic components is integrated within the flexible printed circuit (FPC) as part of the assembly, the protective mesh configured to align with the port of the housing when the FPC is included in the computing device is assembled to protect the or more electronic components from contaminants from the exterior of the computing device (block 504). For example, a protective mesh 128 as described in this document may be formed as a layer within a stack of layers for the FPC. The FPC including the protective mesh 128 is then adjoined to electronic components 126 to form an intermediate assembly. The intermediate assembly can then be adhered to a housing of the computing device 102 as part of assembly of the computing device.

FIG. 6 depicts an example procedure 600 in which a computing device including an integrated protective mesh to protect electronic components is assembled in accordance with one or more implementations. A housing for a computing device is formed having a port that extends from an exterior of the housing to an interior of the housing to create a pathway through the housing (block 602). For example, a port 204 may be formed through a housing 202 as discussed previously. Circuitry for the computing device is fabricated having one or more electronic components and a protective mesh for the one or more electronic devices that is integrated with the circuitry (block 604). For instance, an FPC 304 or other suitable circuitry 206 to implement device functionality may be fabricated. The circuitry 206 may include one or more electronic components 126, such as audio components 302 or other sensitive devices, examples of which were previously discussed. The circuitry 206 additionally includes a protective mesh 128 that is fabricated as an integrated component of the circuitry 206.

The housing is assembled with the circuitry such that the port is aligned with the one or more electronic components arranged in the interior of the housing to at least partially expose the electronic components to the exterior of the housing via the pathway and the protective mesh is aligned with the port to protect the one or more electronic components from contaminants (block 606). Here, a port 204 in a housing 202 is positioned such that the port 204 aligns with electronic components contained within an FPC or other suitable circuitry 206. As mentioned, the port 204 provides a pathway for some exposure of interior components, such as the conveyance of sound waves, light, pressure variations/pulses, and so forth. A protective mesh 128 is provided to seal the port and pathway and thereby protect the electronic components from contaminants that may degrade or damage the components.

Having considered example details and procedures for integrated protective meshes, consider a discussion of an example system in accordance with one or more implementations.

Example System and Device

Figure 7:
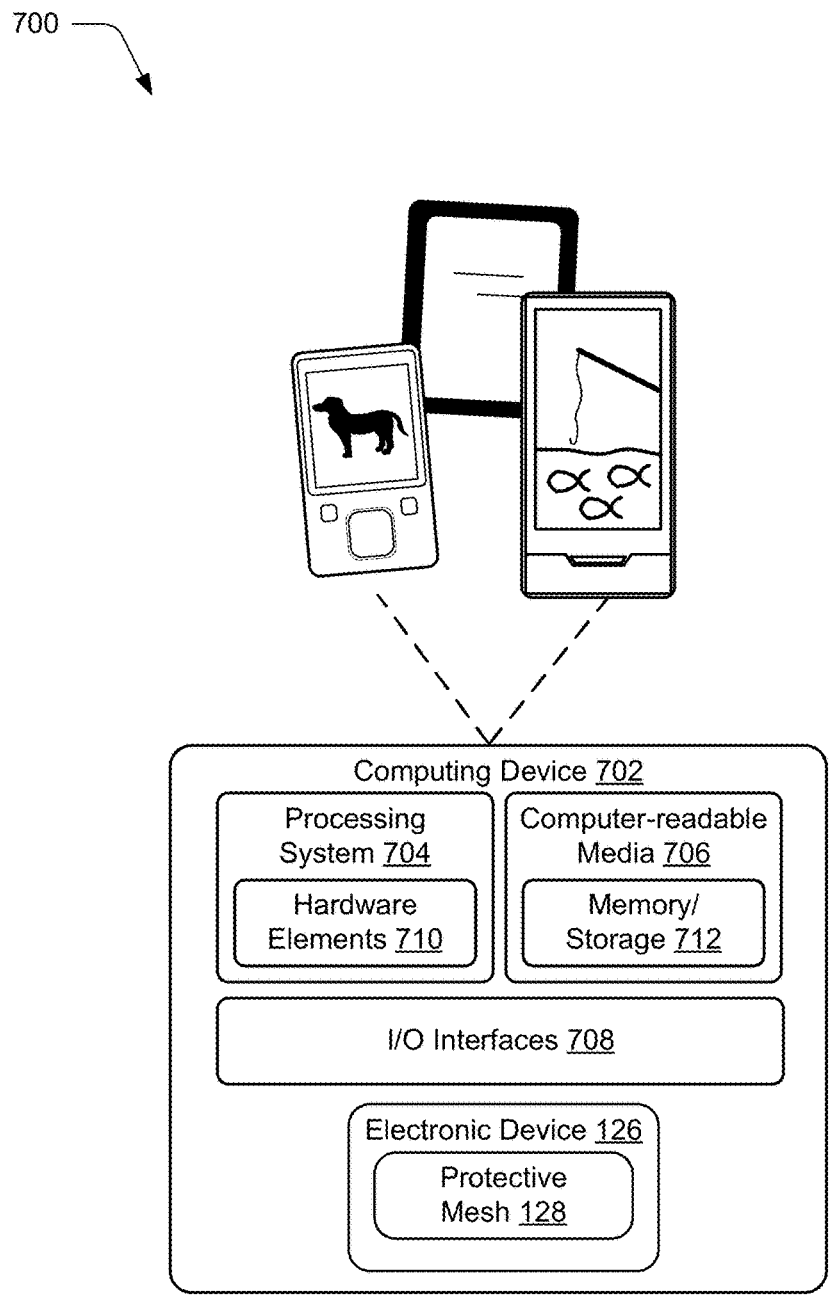
FIG. 7 illustrates an example system that includes an example computing device that is representative of one or more computing systems and/or devices operable to implement the various techniques described herein.

FIG. 7 illustrates an example system generally at 700 that includes an example computing device 702 that is representative of one or more computing systems and/or devices that may implement the various techniques described herein. The computing device 702 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 702 as illustrated includes a processing system 704, one or more computer-readable media 706, and one or more I/O interface 708 that are communicatively coupled, one to another. Although not shown, the computing device 702 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 704 is representative of functionality to perform one or more operations using hardware. Accordingly, the processing system 704 is illustrated as including hardware element 710 that may be configured as processors, functional blocks, and so forth. This may include implementation in hardware as an application specific integrated circuit or other logic device formed using one or more semiconductors. The hardware elements 710 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 706 is illustrated as including memory/storage 712. The memory/storage 712 represents memory/storage capacity associated with one or more computer-readable media. The memory/storage component 712 may include volatile media (such as random access memory (RAM)) and/or nonvolatile media (such as read only memory (ROM), Flash memory, optical disks, magnetic disks, and so forth). The memory/storage component 712 may include fixed media (e.g., RAM, ROM, a fixed hard drive, and so on) as well as removable media (e.g., Flash memory, a removable hard drive, an optical disc, and so forth). The computer-readable media 706 may be configured in a variety of other ways as further described below.

Input/output interface(s) 708 are representative of functionality to allow a user to enter commands and information to computing device 702, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 702 may be configured in a variety of ways to support user interaction. The computing device 702 is further illustrated as being communicatively and physically coupled to an electronic device 126 that is associated with a protective mesh 128 as described herein.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 702. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 702, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 710 and computer-readable media 706 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 710. The computing device 702 may be configured to implement particular instructions and/or functions corresponding to the software and/or hardware modules. Accordingly, implementation of a module that is executable by the computing device 702 as software may be achieved at least partially in hardware, e.g., through use of computer-readable storage media and/or hardware elements 710 of the processing system 704. The instructions and/or functions may be executable/operable by one or more articles of manufacture (for example, one or more computing devices 702 and/or processing systems 704) to implement techniques, modules, and examples described herein.

EXAMPLE IMPLEMENTATIONS

Example implementations of techniques described herein include, but are not limited to, one or any combinations of one or more of the following examples:

Example 1

A computing device comprising: a flexible printed circuit (FPC); one or more electronic components attached to the FPC; a housing having a port for the electronic components that extends from outside of the housing to an interior of the housing to create a pathway through the housing; and a protective mesh assembled as an integrated component of the FPC and configured to align with the port to protect the electronic components from passage of contaminants through the pathway created by the port.

Example 2

A computing device as described in any one or more of the examples in this section, wherein the protective mesh is configured as a membrane that seals the port to provide water-resistance.

Example 3

A computing device as described in any one or more of the examples in this section, wherein the protective mesh acts as a barrier to prevent the contaminants from reaching and degrading the electronic components.

Example 4

A computing device as described in any one or more of the examples in this section, wherein the port enables conveyance of air via the pathway and through the protective mesh between the exterior of the housing and the electronic components.

Example 5

A computing device as described in any one or more of the examples in this section, wherein the flexible printed circuit (FPC) is assembled as a plurality of layers of material, the protective mesh being included as one of the plurality of layers.

Example 6

A computing device as described in any one or more of the examples in this section, wherein the flexible printed circuit (FPC) is adhered to the housing using a single layer of adhesive external to the FPC.

Example 7

A computing device as described in any one or more of the examples in this section, wherein the electronic components are surface mounted to the flexible printed circuit (FPC).

Example 8

A computing device as described in any one or more of the examples in this section, wherein the electronic components include audio components.

Example 9

A computing device as described in any one or more of the examples in this section, wherein the electronic components include at least a microphone device.

Example 10

A computing device as described in any one or more of the examples in this section, wherein the electronic components include at least a speaker device.

Example 11

A computing device as described in any one or more of the examples in this section, wherein the electronic components include a pressure sensitive device.

Example 12

A computing device as described in any one or more of the examples in this section, wherein the electronic components include a photosensitive device.

Example 13

An apparatus comprising: a flexible printed circuit (FPC) for inclusion in a computing device; one or more audio components arranged on the FPC for exposure through a port in a housing of the computing device when the FPC is attached to the housing, the port configured to provide a pathway for sound waves to travel to and from the one or more audio components; and a protective mesh for the one or more audio components integrated with the FPC, the protective mesh configured to align with the port for protection of the audio components from contaminants when the FPC is attached to the housing.

Example 14

An apparatus as described in any one or more of the examples in this section, wherein the protective mesh is formed as a layer of a plurality of layers of material for the flexible printed circuit (FPC).

Example 15

The apparatus as described in any one or more of the examples in this section, wherein an assembly of the flexible printed circuit (FPC) including the protective mesh and the one or more audio components has a thickness equal to or less than about 1.5 millimeters.

Example 16

An apparatus as described in any one or more of the examples in this section, wherein the protective mesh is configured as a hydrophobic membrane having a thickness equal to or less than about 0.01 millimeters.

Example 17

An apparatus as described in any one or more of the examples in this section, wherein the apparatus comprises a wearable computing device.

Example 18

A method comprising: assembling a flexible printed circuit (FPC) for inclusion in a computing device, the FPC configured to arrange one or more electronic devices for exposure to an exterior of the computing device via a port formed through a housing of the computing device when the FPC is included in the computing device; and integrating within the FPC a protective mesh for the one or more electronic devices as part of the assembly, the protective mesh configured to align with the port of the housing when the FPC is included in the computing device to protect the one or more electronic devices from contaminants from the exterior of the computing device.

Example 19

The method as described in any one or more of the examples in this section, wherein assembling the flexible printed circuit (FPC) comprises assembling the protective mesh as a layer within a stack of layers for the FPC.

Example 20

The method as described in any one or more of the examples in this section, further comprising: surface mounting the one or more electronic devices to the flexible printed circuit (FPC); and attaching an assembly of the FPC including the integrated protective mesh and the one or more electronic devices to housing of the computing device.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A computing device comprising:
   a flexible printed circuit (FPC) including a plurality of layers of flexible material;
   one or more electronic components attached to the FPC;
   a housing having a port for the one or more electronic components that extends from outside of the housing to an interior of the housing to create a pathway through the housing; and
   a protective mesh assembled as an integrated component of the FPC, the protective mesh integrated as one of the layers of flexible material assembled in the FPC and configured to align with the port to protect the one or more electronic components from passage of contaminants through the pathway created by the port.

2. A computing device as described in claim 1, wherein the protective mesh is configured as a membrane that seals the port to provide water-resistance.

3. A computing device as described in claim 1, wherein the protective mesh acts as a barrier to prevent the contaminants from reaching and degrading the electronic components.

4. A computing device as described in claim 1, wherein the port enables conveyance of air via the pathway and through the protective mesh between the exterior of the housing and the electronic components.

5. A computing device as described in claim 1, wherein the flexible printed circuit (FPC) is adhered to the housing using a single layer of adhesive external to the FPC.

6. A computing device as described in claim 1, wherein the electronic components are surface mounted to the flexible printed circuit (FPC).

7. A computing device as described in claim 1, wherein the electronic components include audio components.

8. A computing device as described in claim 1, wherein the electronic components include at least a microphone device.

9. A computing device as described in claim 1, wherein the electronic components include at least a speaker device.

10. A computing device as described in claim 1, wherein the electronic components include a pressure sensitive device.

11. A computing device as described in claim 1, wherein the electronic components include a photosensitive device.

12. An apparatus comprising:
- a flexible printed circuit (FPC) for inclusion in a computing device, the FPC formed from a plurality of layers of flexible material;
- one or more audio components arranged on the FPC for exposure through a port in a housing of the computing device when the FPC is attached to the housing, the port configured to provide a pathway for sound waves to travel to and from the one or more audio components; and
- a protective mesh for the one or more audio components integrated with the FPC, the protective mesh integrated as one of the layers of flexible material assembled in the FPC and configured to align with the port for protection of the one or more audio components from contaminants when the FPC is attached to the housing.

13. A computing device as described in claim 1, wherein the plurality of layers of flexible material assembled in the FPC includes one or more conductive layers having traces.

14. The apparatus as described in claim 12, wherein an assembly of the flexible printed circuit (FPC) including the protective mesh and the one or more audio components has a thickness equal to or less than about 1.5 millimeters.

15. An apparatus as described in claim 12, wherein the protective mesh is configured as a hydrophobic membrane having a thickness equal to or less than about 0.01 millimeters.

16. An apparatus as described in claim 12, wherein the apparatus comprises a wearable computing device.

17. The apparatus as described in claim 12, wherein the plurality of layers of flexible material assembled in the FPC include one or more conductive layers having traces configured as routing paths for electrical interconnection.

18. A method comprising:
- assembling a flexible printed circuit (FPC) for inclusion in a computing device, the FPC formed from a plurality of layers of flexible material, the FPC configured to arrange one or more electronic devices for exposure to an exterior of the computing device via a port formed through a housing of the computing device when the FPC is attached to the housing in the computing device; and
- integrating within the FPC a protective mesh for the one or more electronic devices, the protective mesh integrated as one of the layers of flexible material assembled in the FPC as part of the assembly, the protective mesh configured to align with the port of the housing when the FPC is included in the computing device to protect the one or more electronic devices from contaminants from the exterior of the computing device.

19. The method as described in claim 18, wherein assembling the flexible printed circuit (FPC) comprises assembling the protective mesh as a layer within a stack of the plurality of layers of flexible material for the FPC.

20. The method as described in claim 18, further comprising:
- surface mounting the one or more electronic devices to the flexible printed circuit (FPC); and
- attaching an assembly of the FPC including the integrated protective mesh and the one or more electronic devices to the housing of the computing device.

* * * * *